United States Patent
Lin et al.

(10) Patent No.: US 9,888,527 B2
(45) Date of Patent: Feb. 6, 2018

(54) SYSTEMS FOR PROCESSING SEMICONDUCTOR DEVICES, AND METHODS OF PROCESSING SEMICONDUCTOR DEVICES

(71) Applicant: Taiwan Semiconductor Manufacturing Company, Ltd., Hsin-Chu (TW)

(72) Inventors: Hsiu-Jen Lin, Zhubei (TW); Wei-Yu Chen, Taipei (TW); Ai-Tee Ang, Hsin-Chu (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 455 days.

(21) Appl. No.: 14/155,050

(22) Filed: Jan. 14, 2014

(65) Prior Publication Data

US 2015/0201462 A1 Jul. 16, 2015

(51) Int. Cl.
*A21B 1/22* (2006.01)
*H05B 3/02* (2006.01)
(Continued)

(52) U.S. Cl.
CPC ......... *H05B 3/02* (2013.01); *H01L 21/67721* (2013.01); *H01L 21/6838* (2013.01); *H01L 24/75* (2013.01); *H01L 24/81* (2013.01); *H01L 2224/131* (2013.01); *H01L 2224/16225* (2013.01); *H01L 2224/16227* (2013.01); *H01L 2224/7598* (2013.01); *H01L 2224/75744* (2013.01); *H01L 2224/81191* (2013.01); *H01L 2224/81815* (2013.01); *H01L 2224/97* (2013.01); *H01L 2924/3511* (2013.01); *Y10T 29/41* (2015.01)

(58) Field of Classification Search
CPC ..... H01L 2224/131; H01L 2224/81815; H01L 2224/97; H01L 2224/81; H01L 2924/00014; H01L 2924/014; H01L 21/67721; H01L 21/6838; H01L 2224/16225; H01L 2224/16227; H01L 2224/75744; H01L 2224/7598; H01L 2224/81191; H01L 24/75; H01L 24/81; H01L 2924/3511; H05B 3/02; Y10T 29/41
USPC ....................................... 219/411
See application file for complete search history.

(56) References Cited

U.S. PATENT DOCUMENTS 5,447,886 A 9/1995 Rai
5,802,856 A * 9/1998 Schaper .................. B01L 7/52
118/724

(Continued)

FOREIGN PATENT DOCUMENTS

CN 102386114 A 3/2012
TW 200615074 5/2006
(Continued)

*Primary Examiner* — Sang Y Paik
(74) *Attorney, Agent, or Firm* — Slater Matsil, LLP (57) ABSTRACT

Systems for processing semiconductor devices, and methods of processing semiconductor devices are disclosed. In some embodiments, a system for processing semiconductor devices includes a radiation energy source, a support, and a tool disposable between the support and the radiation energy source. The tool includes apertures adapted to retain a package component over the support. The system includes a cooling device proximate the support.

20 Claims, 7 Drawing Sheets

(51) Int. Cl.
*H01L 21/677* (2006.01)
*H01L 21/683* (2006.01)
*H01L 23/00* (2006.01)

(56) References Cited

U.S. PATENT DOCUMENTS

| | | | |
|---|---|---|---|
| 6,344,407 | B1 | 2/2002 | Matsuki et al. |
| 6,432,744 | B1* | 8/2002 | Amador ............... H01L 21/4846 257/E21.508 |
| 6,834,158 | B1* | 12/2004 | Templeton ................ G03F 7/40 118/50.1 |
| 7,455,213 | B2 | 11/2008 | Nishiyama |
| 7,612,386 | B2* | 11/2009 | Ng .......................... H01L 23/36 257/100 |
| 8,042,727 | B2 | 10/2011 | Shirai et al. |
| 8,104,666 | B1 | 1/2012 | Hwang et al. |
| 9,010,617 | B2 | 4/2015 | Yu et al. |
| 2007/0141751 | A1 | 6/2007 | Mistry et al. |
| 2008/0169282 | A1* | 7/2008 | Sorabji ............. H01L 21/67109 219/444.1 |
| 2009/0137084 | A1* | 5/2009 | Kida ...................... H01L 24/16 438/107 |
| 2012/0175403 | A1* | 7/2012 | Yu .......................... H01L 24/81 228/101 |
| 2012/0291950 | A1 | 11/2012 | Sugiyama et al. |

FOREIGN PATENT DOCUMENTS

| | | |
|---|---|---|
| TW | I258197 B | 7/2006 |
| TW | 201137994 | 11/2011 |
| TW | 201230215 A | 7/2012 |
| TW | 201230260 | 7/2012 |

* cited by examiner

SYSTEMS FOR PROCESSING SEMICONDUCTOR DEVICES, AND METHODS OF PROCESSING SEMICONDUCTOR DEVICES

PRIORITY CLAIM AND CROSS-REFERENCE

This application relates to the following co-pending and commonly assigned patent application Ser. No. 13/559,318, filed on Jul. 26, 2012, entitled, "Warpage Control in the Packaging of Integrated Circuits," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, as examples.

In some packaging methods for integrated circuits, device dies or packages are packaged onto package substrates, which include metal connections that are used to route electrical signals between opposite sides of the package substrates. The device dies may be bonded onto one side of a package substrate using flip chip bonding, and a reflow process may be performed to melt solder balls that interconnect the dies and the package substrates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4, 5, and 7 through 11 illustrate cross-sectional views, and

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the present disclosure are related to systems for processing semiconductor devices, and methods of processing semiconductor devices using the systems. The systems include a cooling device for decreasing the temperature of a package component after a solder reflow process for semiconductor devices in some embodiments, which will be described further herein.

Figure 1:
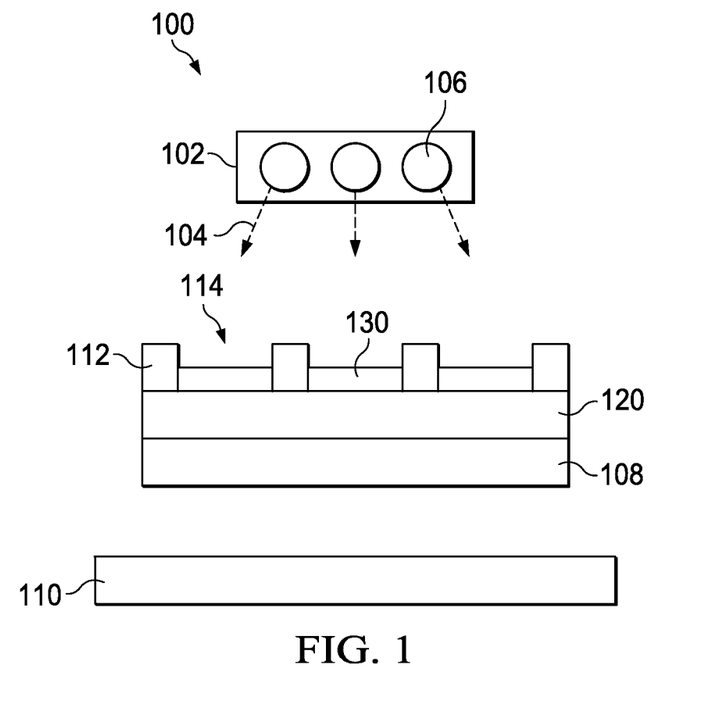
FIG. 1 is a block diagram of a system for processing semiconductor devices in accordance with some embodiments.

Referring first to FIG. 1, there is shown a block diagram of a system 100 for processing semiconductor devices in accordance with some embodiments. The system 100 includes a radiation energy source 102 and a support 108. The system 100 includes a tool 112 disposable between the support 108 and the radiation energy source 102. The system 100 also includes a cooling device 110 proximate the support 108.

The radiation energy source 102 is adapted to emit radiation energy 104 towards the support 108; e.g., towards the tool 112 and a package component 130 disposed over the support 108. The radiation energy source 102 includes an infrared lamp 106 in some embodiments. The radiation energy source 102 includes a plurality of infrared lamps 106 in some embodiments, as illustrated in FIG. 1. The radiation energy source 102 may alternatively comprise other types of radiant energy emitting devices.

The tool 112 includes a plurality of apertures 114 that are adapted to retain a package component over the support 108. For example, in FIG. 1, a first package component 120 is disposed over the support 108, and the tool 112 is disposed over the first package component 120. A plurality of second package components 130 are disposed within the apertures 114 of the tool 112 over the first package component 120. The tool 112 comprises a jig or a cover that may be used in a solder reflow process or a solder bonding process to retain the second package components 130 in a desired position over the first package component 120 during the solder reflow or bonding process in some embodiments, for example. The apertures 114 of the tool 112 may comprise a dimension that is substantially the same as, or slightly larger than, the size of the second package components 130 in a top view in accordance with some embodiments, for example. In accordance with some embodiments, the plurality of apertures 114 of the tool 112 are adapted to support a plurality of the second package components 130 on the first package component 120, for example, during and after a eutectic material bonding process or solder bonding process.

The radiation energy source 102 is adapted to increase a temperature of the second package components 130 to reflow a eutectic material disposed between the plurality of second package components 130 and the first package component 120, and/or the radiation energy source 102 is adapted to maintain a temperature of the second package components 130 while the cooling device 110 reduces the temperature of the first package component 120 while the eutectic material solidifies, in some embodiments, to be described further herein. Reflowing the eutectic material and solidifying (e.g., re-solidifying) the eutectic material comprise bonding the second package components 130 to the first package component 120 in some embodiments, also to be described further herein.

The cooling device 110 is used to decrease the temperature of the first package component 120 after a eutectic material reflow process. For example, a eutectic material (see eutectic material 134 shown in FIG. 9) may be disposed between the first package component 120 and the second package components 130, and the eutectic material is reflowed by exposing the second package components 130 to radiation energy 104 emitted from the radiation energy source 102. After the reflow process, the cooling device 110 is activated to cool the first package component 120 disposed over the support 108, which reduces or eliminates deleterious effects of a coefficient of thermal expansion (CTE) mismatch between the first package component 120 and the second package components 130 in some embodiments, to be described further herein.

The cooling device 110 comprises a cooling module in some embodiments that is disposed proximate the support 108, as illustrated in FIG. 1. The cooling module contains a cooling agent in some embodiments. The cooling agent may comprise water, a liquid fluorinated hydrocarbon such as Freon™ by E. I. du Pont de Nemours and Company, liquid nitrogen, or other materials, as examples, in some embodiments. The cooling module may include a device adapted to move air or gas proximate the support 108, such as a fan, in some embodiments. The cooling device 110 may comprise a cooling coil filled with a liquid that is circulated and returned to a refrigeration module, as another example, not shown. Alternatively, the cooling module and cooling agent of the cooling device 110 may comprise other materials and devices.

Figure 2:
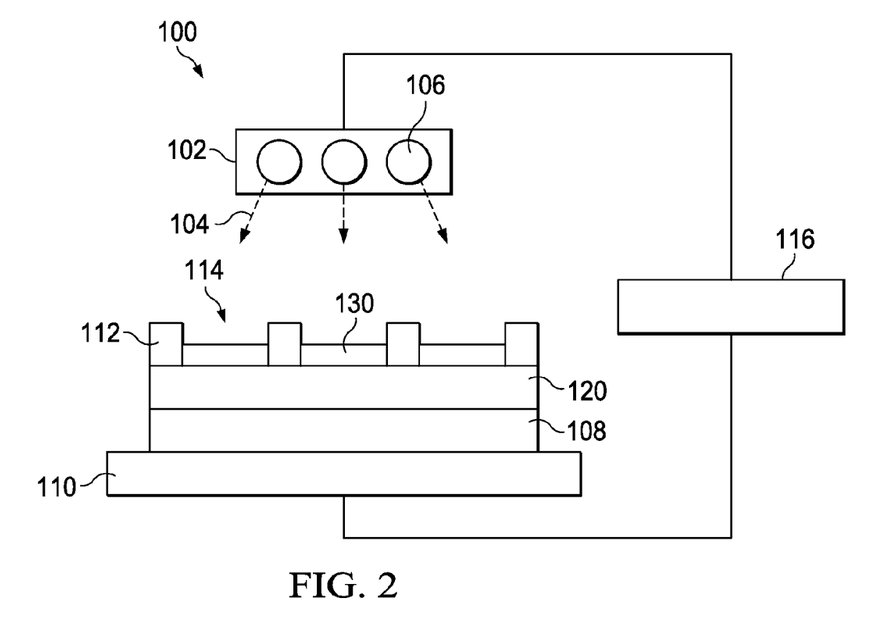
FIG. 2 is a block diagram of a system for processing semiconductor devices in accordance with some embodiments.

FIG. 2 is a block diagram of a system 100 for processing semiconductor devices in accordance with some embodiments. The system 100 includes a controller 116. The controller 116 is in communication with the cooling device 110 and the radiation energy source 102. The controller 116 may be electrically and/or mechanically coupled to the cooling device 110 and/or the radiation energy source 102, for example. The controller 116 is adapted to monitor, regulate, and/or adjust the temperatures of the heating and cooling of the radiation energy source 102 and the cooling device 110, respectively. In some embodiments, the controller 116 comprises a temperature analyzer and a programmable logic controller (PLC) manufactured by Siemens Corporation, for example. Alternatively, the controller 116 may have other or alternative functions, and different types of equipment and equipment supplied by other manufacturers may be used.

In the embodiments shown in FIG. 2, the cooling device 110 is placed directly adjacent and abutting the support 108.

Alternatively, the cooling device 110 may be placed proximate the support 108, as shown in FIG. 1. The controller 116 shown in FIG. 2 may also be included in the embodiments of the systems 100 shown in FIGS. 1 and 3.

Figure 3:
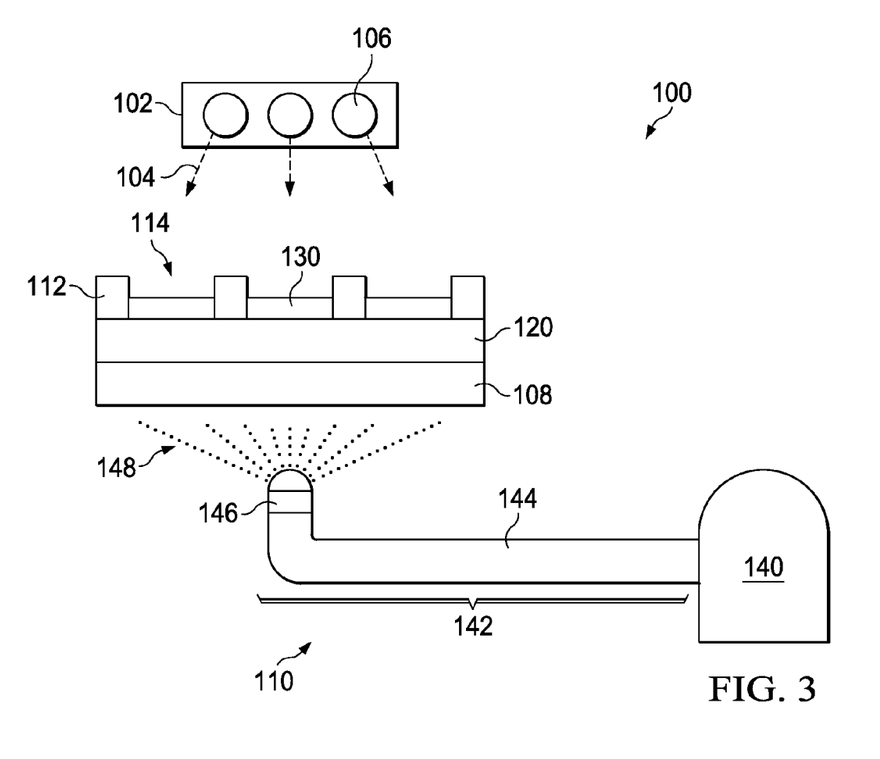
FIG. 3 is a block diagram of a system for processing semiconductor devices in accordance with some embodiments.

FIG. 3 is a block diagram of a system 100 for processing semiconductor devices in accordance with some embodiments. The cooling device 110 includes a reservoir 140 for containing a cooling substance 148 and a dispensing means 142 coupled to the reservoir 140. The reservoir 140 is adapted to contain liquid nitrogen, water, or other coolants, in some embodiments. For example, the cooling substance 148 comprises liquid nitrogen or water in some embodiments. The dispensing means 142 may include a pipe or tube 144 coupled between the reservoir 140 and a nozzle 146 or other type of controlled aperture disposed at the end of the pipe or tube 144. Alternatively, the dispensing means 142 may comprise other devices and/or configurations.

In some embodiments, the support 108, the tool 112, the radiation energy source 102, and the cooling device 110 shown in FIGS. 1, 2, and 3 comprise components of the systems 100. The systems 100 may comprise enclosed systems contained within a chamber, or the systems 100 may be unenclosed. The systems 100 may include other functional elements. The solder reflow systems 100 may comprise static systems wherein the support 108 remains stationary during the reflow process. Alternatively, the systems 100 may include a conveyor belt (not shown), and the support 108 may be placed on the conveyor belt. The support 108 with the first package components 120, the second package components 130, and the tool 112 disposed thereon is moved by the conveyor belt, and the systems 100 may include one or more radiation energy sources 102 that expose the tool 112 and second package components 130 to the radiation energy 104. The systems 100 may alternatively comprise other configurations.

Figure 4:
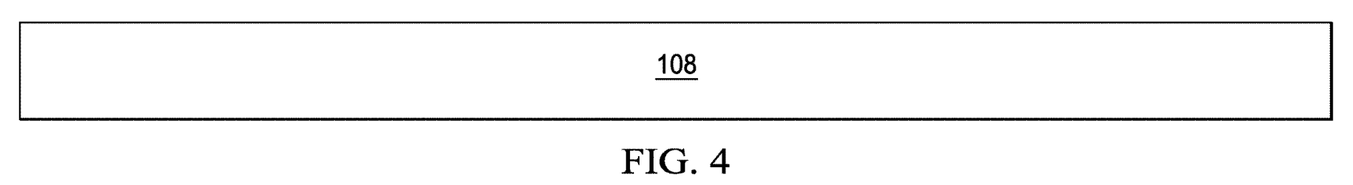
Figure 5:
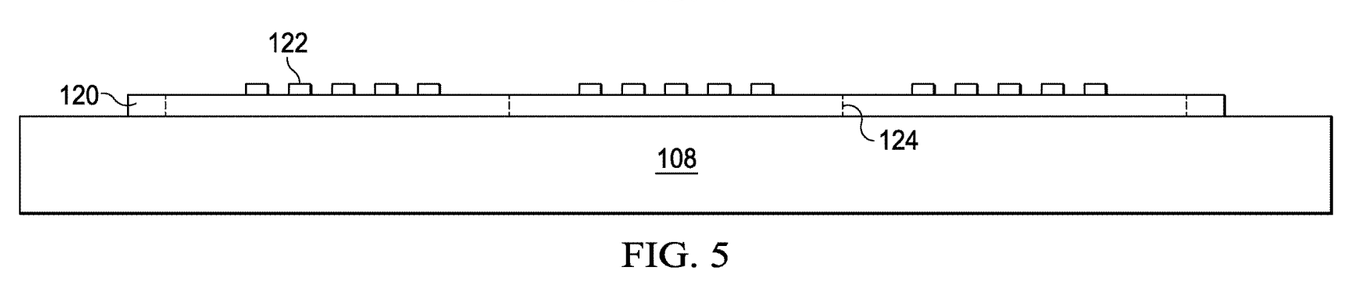
Figure 6:
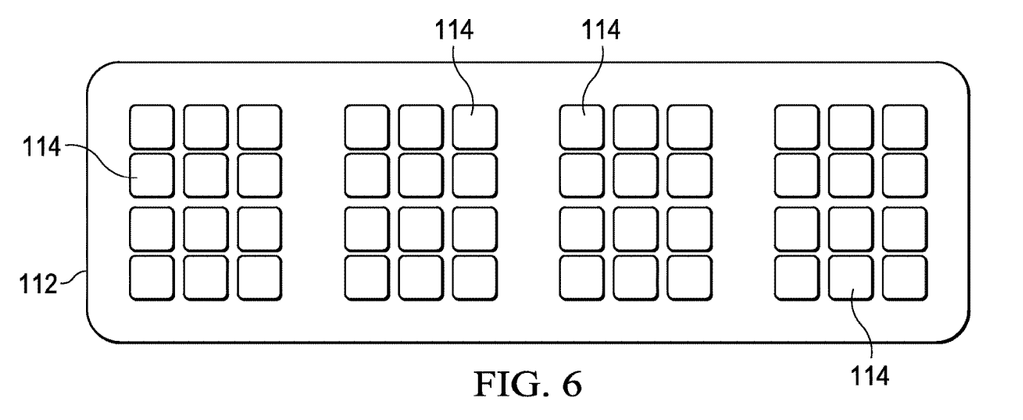
FIG. 6 shows a top view, of a method of processing semiconductor devices at various stages in accordance with some embodiments.

FIGS. 4, 5, and 7 through 11 illustrate cross-sectional views and FIG. 6 shows a top view of a method of processing semiconductor devices at various stages in accordance with some embodiments of the present disclosure. In FIG. 4, a support 108 is provided. The support 108 comprises a thickness of about 5 mm to about 10 mm of a Fe alloy, an Al alloy, or combinations or multiple layers thereof, as examples. The support 108 and also the tool 112 (see FIGS. 6 and 7) may comprise a length and width in a top view of about 300 mm×about 700 mm, as examples. Alternatively, the support 108 (and also the tool 112) may comprise other materials and dimensions. In some embodiments, the support 108 comprises a board or a boat adapted to support a first package component 120 (see FIG. 5).

In FIG. 5, a package component 120 is provided. The package component 120 is placed on the support 108. The package component 120 comprises a packaging device in some embodiments. The package component 120 is also referred to herein as a first package component 120, a plurality of first package components 120, or a strip of a plurality of first package components 120. In some embodiments, the first package component 120 comprises a packaging device comprising an interposer substrate comprising through-vias, other circuitry, and/or one or more redistribution layers (RDLs) disposed thereon or formed therein (not shown). In other embodiments, the first package component 120 comprises a packaging device comprising an organic material. The first package component 120 may comprise a laminate substrate, which includes a plurality of dielectric films laminated together. At least one of the dielectric films of the first package component 120 comprises an extra-low dielectric constant (ELK) material having a dielectric constant of less than a dielectric constant of silicon dioxide, in some embodiments. In yet other embodiments, the first package component 120 comprises a plurality of integrated circuit dies. The first package component 120 may alternatively comprise other materials and types of devices.

In some embodiments, the first package component 120 comprises a strip of a plurality of the first package components 120. For example, the strip of the plurality of first package components 120 may comprise substantially a same shape and/or dimensions as the tool 112, in the top view shown in FIG. 6. The strip includes one of the first package components 120 proximate each one of the apertures 114 of the tool 112, for example. The first package components 120 may be distributed uniformly throughout the strip, and may have a pattern of an array. In other embodiments, the first package components 120 may be distributed as a plurality of groups, with the inter-group spacing between the groups being greater than the inner-group spacing between first package components that are in the same group, as shown for the apertures 114 of the tool 112 in the top view in FIG. 6. The individual first package components 120 are later singulated along scribe lines 124 of the strip of first package components 120 after a solder reflow process, in some embodiments.

The strip of first package components 120 comprises a plurality of regions where second package components 130 will be bonded to the first package components 120, to be described further herein. For example, the first package components 120 include a plurality of contact pads 122 formed thereon. Only three regions including five contact pads 122 each are shown in FIGS. 5 and 7 through 11; alternatively, dozens, hundreds, or more contact pads 122 may be disposed in each region where a second package component 130 will be bonded to the first package component 120, in some embodiments. The contact pads 122 comprise electrical connections, and may comprise pre-solder regions, metal pads, non-reflowable metal bumps, or metal features, as examples. The contact pads 122 may be coupled to bond pads on an opposite side of the first package components 120, not shown, by electrical features such as metal lines and vias disposed within the first package components 120, also not shown, in some embodiments.

A tool 112 described herein with reference to FIGS. 1 through 3 is provided, as shown in a top view in FIG. 6. An example of a pattern for the apertures 114 is shown. The tool 112 comprises a metal or metal alloy such as copper, aluminum, steel or the like; one or more ceramic materials; or a combination or multiple layers thereof in accordance with some embodiments. The tool 112 comprises a thickness of about 1 mm to about 3 mm in some embodiments, for example. Alternatively, the tool 112 may comprise other materials and dimensions.

The tool 112 is adapted to retain a package component over the support 108 within one of the apertures 114. The apertures 114 may comprise a dimension that is substantially the same as, or slightly larger than, the size of a second package component 130 (see FIG. 8) in a top view in accordance with some embodiments, for example.

Figure 7:
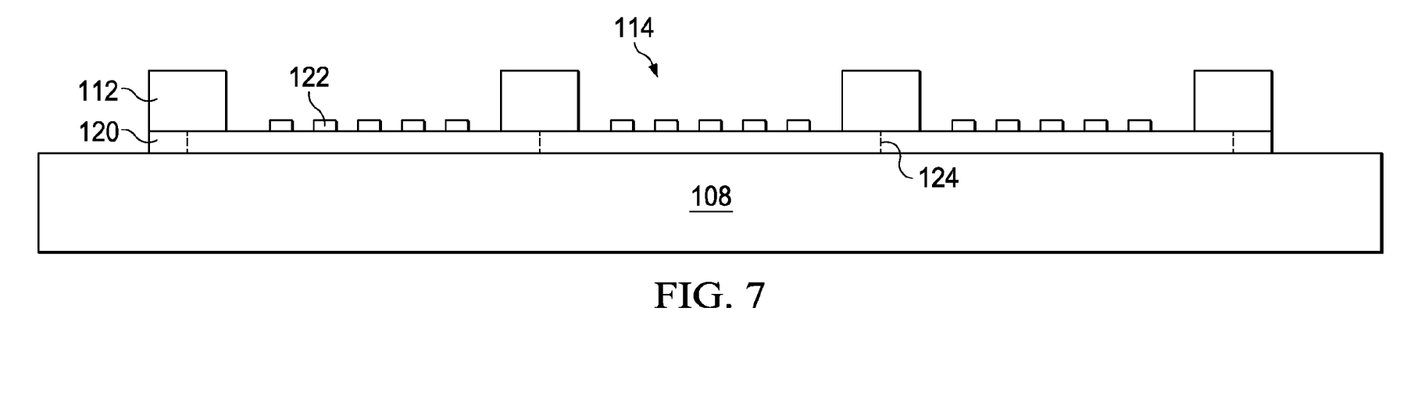

The tool 112 is disposed or placed over the first package component 120 that is disposed on the support 108, as shown in FIG. 7. The apertures 114 of the tool 112 are disposed over the first package components 120 of the strip of the first package components so that the first package components 120 are exposed. Other portions of the tool 112, i.e., the solid portions, are disposed over and proximate the scribe line regions 124 of the strip of the first package components 120, between the apertures 114.

The tool 112 may be placed directly adjacent and abutting the first package component 120 as shown in FIG. 7 in some embodiments. The tool 112 may be clamped to the support 108 or another object in some embodiments, for example. In other embodiments, the tool 112 may be placed proximate the first package component 120 yet not abutting the first package component 120 (not shown). The apertures 114 of the tool 112 leave the contact pads 122 of the first package components 120 exposed. The contact pads 122 of the first package components 120 are exposed through the apertures 114 in the tool 112, permitting access to the contact pads 122 for a bonding process.

Figure 8:
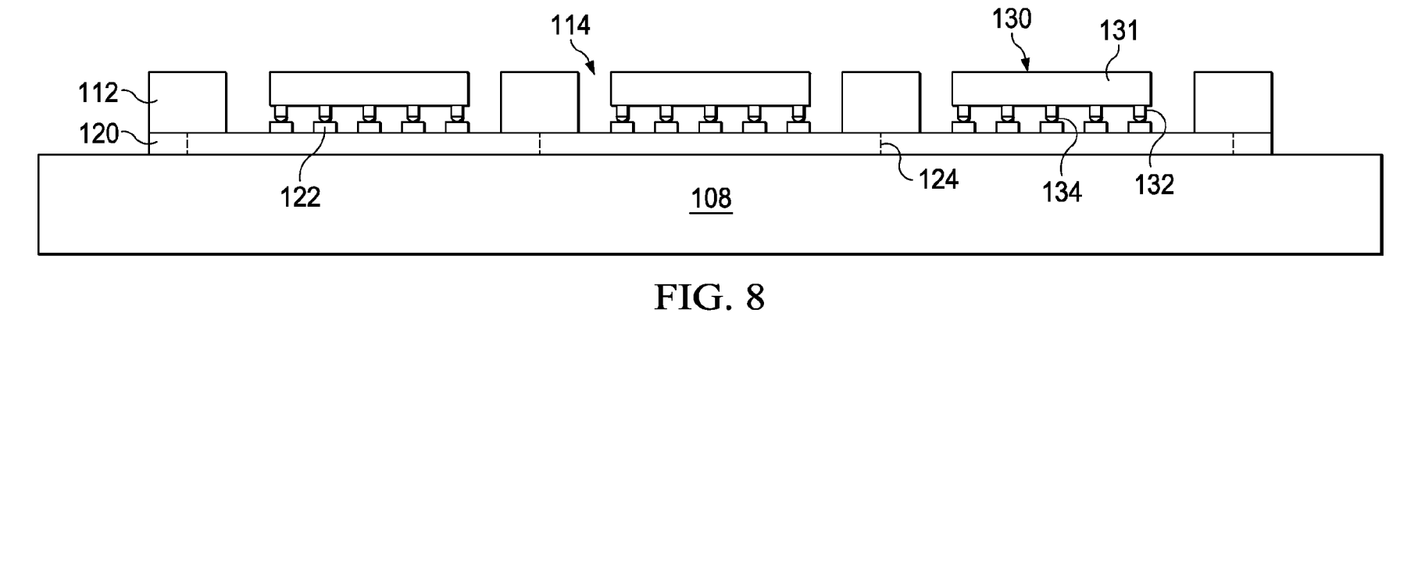

A package component 130 is placed within at least one of the plurality of apertures 114 of the tool 112 disposed over the first package components 120 in some embodiments, as shown in FIG. 8. The package components 130 are also referred to herein as second package components 130. In some embodiments, a plurality of second package components 130 is placed within the plurality of apertures 114 of the tool 112, with one of the plurality of second package components 130 being placed within each one of the plurality of apertures 114 of the tool 112, as illustrated in FIG. 8. The second package components 130 are placed over the first package components 120 with a one-to-one correspondence, for example. In other embodiments, second package components 130 are placed within only some of the plurality of apertures 114 of the tool 112, not shown. In yet other embodiments, two or more second package components 130 may be placed within each aperture 114 of the tool 112, not shown.

Portions of the tool 112 surround the second package components 130. In some embodiments, the portions of the tool 112 surround the second package components 130 securely, to retain the second package components 130 in place while processing the semiconductor devices, such as performing a solder reflow or bonding process.

The second package components 130 comprise semiconductor dies or semiconductor devices in some embodiments. The semiconductor dies may comprise complementary metal oxide (CMOS) devices in some embodiments, for example. Alternatively, the semiconductor dies may comprise other types of integrated circuits. In other embodiments, the second package components 130 may comprise package substrates. Alternatively, the second package components 130 may comprise other types of devices. In some embodiments, the second package components 130 are flip-chip bonded to the first package components 120, for example.

The first package components 120 are also referred to herein as second package components, e.g., in some of the claims. Likewise, the second package components 130 are also referred to herein as first package components, e.g., in some of the claims. The package components 120 and 130 are referred to as "first" or "second" depending on their order of introduction into some of the claims.

The second package components 130 each include a workpiece 131. The workpiece 131 may include a semiconductor substrate comprising silicon or other semiconductor materials and may be covered by an insulating layer, for example. The workpiece 131 may also include other active components or circuits, not shown. The workpiece 131 may comprise silicon oxide over single-crystal silicon, for example. The workpiece 131 may include other conductive layers or other semiconductor elements, e.g., transistors, diodes, etc. Compound semiconductors, GaAs, InP, Si/Ge, or SiC, as examples, may be used in place of silicon. The workpiece 131 may comprise a silicon-on-insulator (SOI) or a germanium-on-insulator (GOI) substrate, as examples.

The second package components 130 include a plurality of contact pads 132 disposed on one side of the workpiece 131. The plurality of contact pads 132 comprise a similar or substantially the same footprint as the contact pads 122 of the first package components 120 in some embodiments. The contact pads 132 of the second package components 130 will be bonded to the contact pads 122 of the first package components 120 using a system 100 shown in FIG. 1, 2, or 3, to form an electrical and mechanical connection between the second package components 130 and the first package components 120 in accordance with some embodiments, to be described further herein.

Referring again to FIG. 8, a eutectic material 134 is disposed between the contact pads 122 of the first package components 120 and the contact pads 132 of the second package components 130. The eutectic material 134 comprises solder regions that are disposed between the first package components 120 and the second package components 130. For example, in FIG. 8, the second package components 130 include a eutectic material 134 disposed over or formed on the contact pads 132. Alternatively, the eutectic material 134 may be disposed on the contact pads 122 of the first package components 120, or the eutectic material 134 may be disposed on both contact pads 122 and contact pads 132, not shown.

The eutectic material 134 comprises a material that is adapted to reflow at a predetermined elevated temperature or temperature range. After elevating the temperature of the eutectic material, when the temperature is lowered, the eutectic material 134 re-solidifies, and a joint comprised of the eutectic material 134 is formed between the contact pads 132 on the second package components 130 and the contact pads 122 on the first package component 120. The eutectic material 134 may comprise a conductive bump, for example. In some embodiments, the eutectic material 134 comprises solder, and may comprise a solder bump or a solder ball, for example.

The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free eutectic material 134 such as solder balls may be formed from SnCu compounds as well, without the use of silver (Ag). Alternatively, lead-free solder connectors may include tin and silver, Sn—Ag, without the use of copper. The eutectic material 134 may be one among an array of conductive bumps formed as a grid, often referred to as a ball grid array (BGA), in some embodiments. The eutectic material 134 may alternatively be arranged in other shapes and configurations. The eutectic material 134 may comprise spherical conductive connectors and may also comprise non-spherical conductive connectors, for example. The eutectic material 134 may be formed on the second package components 130 using a solder ball drop process, a solder bath process, a solder dip process, or other methods.

The tool 112 establishes and retains the second package components 130 in predetermined locations within the apertures 114 so that the eutectic material 134 on the contact pads 132 of the second package components 130 becomes aligned with and stays aligned with the contact pads 122 on the first package components 120. An alignment process and/or realignment process may be used to attain the correct alignment of the second package components 130 with the first package components 120 using alignment devices and/or alignment marks on the first package components 120, tool 112, and/or second package components 130 (not shown), in some embodiments.

Figure 9:
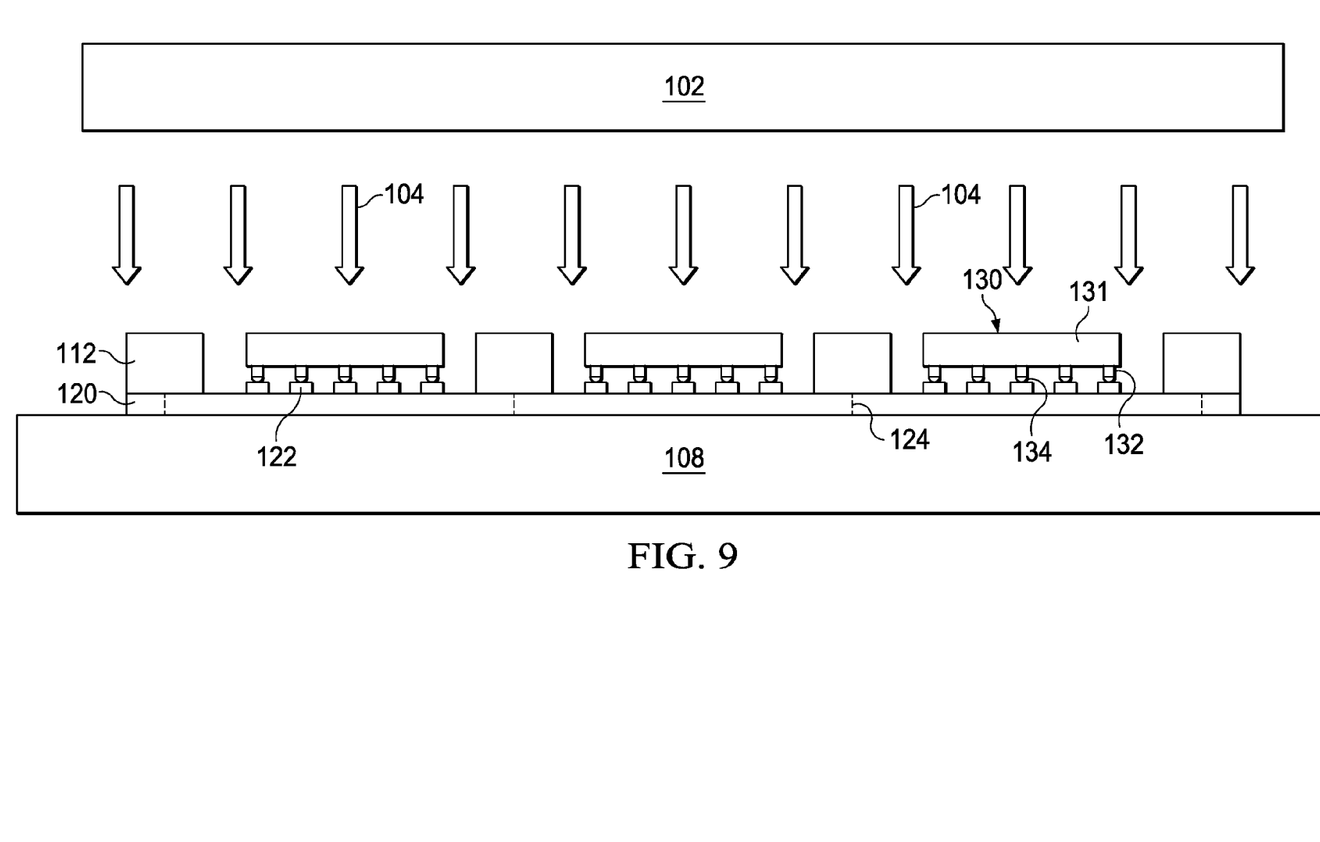

Next, a process is performed on the second package components 130, as shown in FIG. 9. In some embodiments, the process performed is a eutectic material 134 reflow process or solder reflow process. The reflow process causes the eutectic material 134 to reflow, so that the second package components 130 are bonded to the respective underlying first package components 120. In some embodiments, the reflow process is performed using the radiation energy source 102 which comprises a convection-type reflow apparatus that includes at least one IR energy source, such as an IR lamp 106 (see FIG. 1, 2, or 3) or other type of IR radiant source. The reflow process comprises heating the eutectic material 134 to a temperature higher than the melting temperature of the eutectic material 134, and hence causes the eutectic material 134 to become molten.

In some embodiments, the eutectic material 134 is reflowed using the radiation energy source 102 as shown in FIG. 9, by activating the radiation energy source 102 to emit radiation energy 104. The radiation energy 104 is directed towards the second package components 130. In some embodiments, the emission of the radiation energy 104 from the radiation energy source 102 to re-flow the eutectic material 134 comprises increasing a temperature of the second package components 130 to a temperature of about 240 degrees C. to about 260 degrees C. In other embodiments, exposing the second package components 130 to the radiation energy 104 comprises increasing a temperature of the second package components 130 to a temperature of about 217 degrees C. or greater. Alternatively, other temperatures may be used for the eutectic material 134 reflow process. The second package components 130 absorb the radiation energy 104 so that the underlying eutectic material 134 reaches a melting or reflow temperature. The tool 112 retains the second package components 130 and prevents them from moving while the eutectic material 134 is molten.

The radiation energy 104 exposure process is continued for a predetermined time period that is adequate to form good solder joints comprised of the eutectic material 134. For example, the radiation energy source 102 may be activated or implemented for a period of about 0.8 micro-minute to about 100 micro-minutes in some embodiments. Alternatively, other time durations of the radiation energy 104 exposure process may be used.

Exposing the tool 112 and the second package components 130 to the radiation energy 104 comprises reflowing the eutectic material 134 disposed on each of the plurality of second package components 130, e.g., disposed over the contact pads 132. After the end of the reflow process, the eutectic material 134 is cooled and at least substantially, or fully, solidifies.

Figure 10:
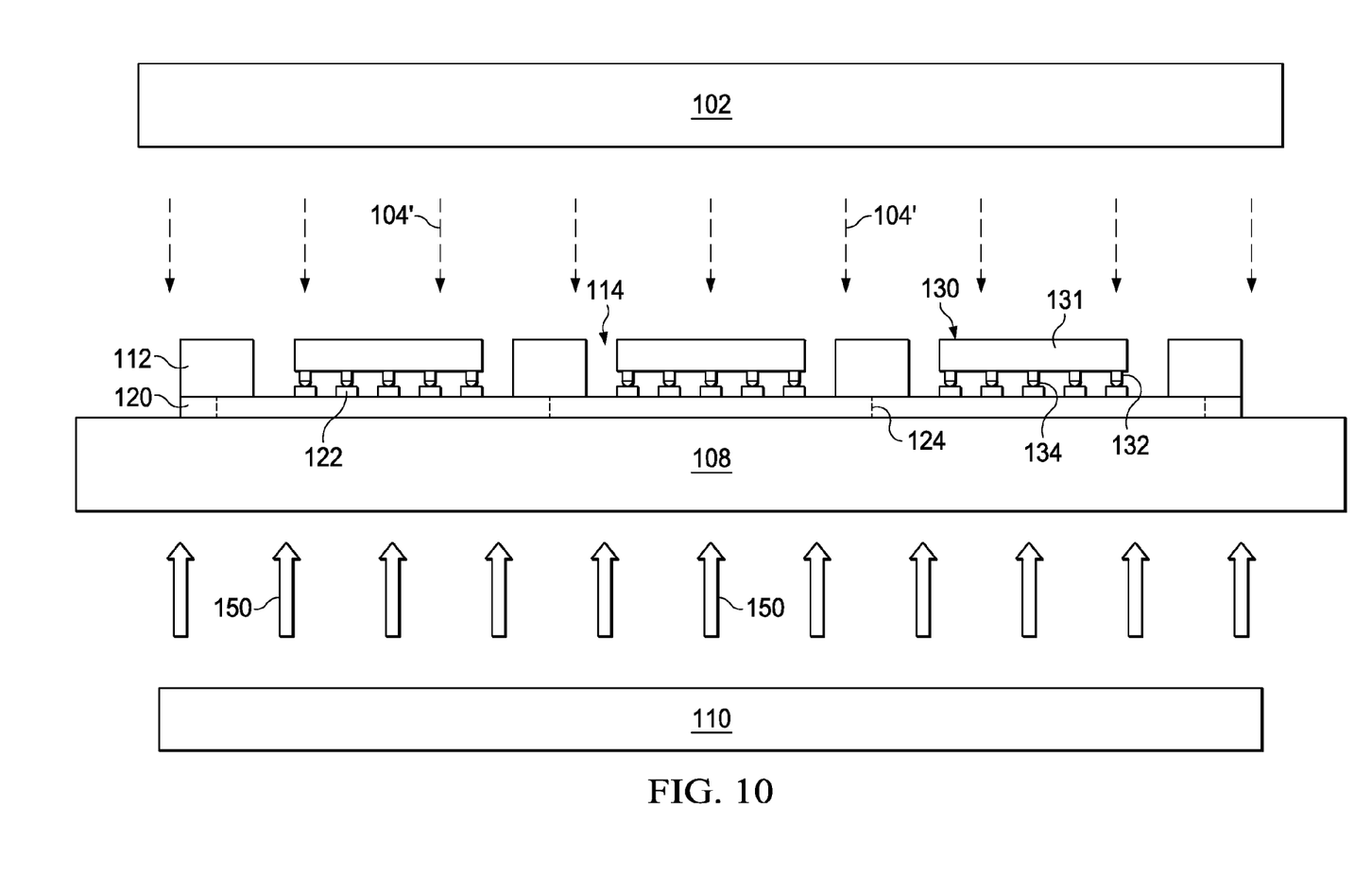

In accordance with some embodiments of the present disclosure, while the eutectic material 134 is cooling, the cooling device 110 is activated to cool the first package components 120, as shown in FIG. 10. The cooling of the first package components 120 by the cooling device 110 is shown by the arrows 150 in FIG. 10. Cooling the first package components 120 comprises lowering a temperature of the first package components 120 to a temperature of about 100 degrees C. or less in some embodiments, for example. In other embodiments, the temperature of the first package components 120 is lowered to a temperature of about 80 degrees C. or less, as another example. The temperature is maintained at the lowered temperature until the eutectic material 134 substantially or fully re-solidifies in some embodiments, for example. Alternatively, other temperatures may be used.

In some embodiments, while the cooling device 110 is activated to cool the first package components 120, the radiation energy source 102 is also activated to expose the second package components 130 to radiation energy 104' while the first package components 120 are cooled, as shown in FIG. 10 in phantom (e.g., in dashed lines). The radiation energy source 102 may be activated to emit an amount of radiation energy 104' to maintain a temperature of the second package components 130 to a temperature of about 180 degrees C. or less, for example. Alternatively, other temperatures may be used.

Cooling the first package components 120, or both cooling the first package components 120 and heating the second package components 130, during the re-solidification of the eutectic material 134 between the first package components 120 and the second package components 130 advantageously prevents damage such as delamination of various material layers of the first package components 120, which may comprise organic materials or ELK materials in some embodiments. Cooling the first package components 120 also facilitates in the cooling of the eutectic material 134 to form re-solidified eutectic bonds between the first package components 120 and the second package components 130.

The controller 116 shown in FIG. 2 is implemented in some embodiments to monitor, regulate, and control the heating and cooling processes shown in FIGS. 9 and 10, for example.

After the cooling process shown in FIG. 10, the re-solidified eutectic material 134 bonds results in the electrical and mechanical bonding of the second package components 130 to the first package components 120. The second package components 130 are thus bonded to the underlying first package components 120.

Figure 11:
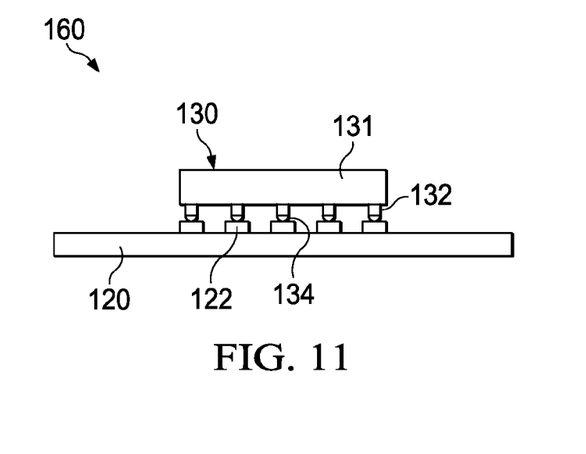

After the eutectic material 134 reflow and cooling processes, the tool 112 is removed, and the strip of first package components 120 is singulated along scribe lines 124 between adjacent ones of the plurality of second package components 130. Singulating the strip of first package components 120 comprises forming a plurality of packaged semiconductor devices 160, as shown in FIG. 11. The packaged semiconductor devices 160 may comprise packaged semiconductor dies, stacked dies, systems-on-a-chip (SOCs), wafer level package (WLP) devices, other types of devices, and/or combinations thereof in accordance with some embodiments.

For example, in embodiments wherein the first package components 120 comprise packaging substrates and the second package components 130 comprise semiconductor dies, or wherein the first package components 120 comprise semiconductor dies and the second package components 130 comprise packaging systems, the packaged semiconductor dies 160 comprise packaged semiconductor dies. The packaged semiconductor dies may comprise wafer level package (WLP) devices in some embodiments, for example.

In embodiments wherein the first package components 120 comprise semiconductor dies and the second package components 130 comprise semiconductor dies, packaged semiconductor devices 160 comprising stacked dies are formed. In embodiments wherein the first package components 120 comprise particular types of semiconductor dies (also not shown) that are adapted to function collectively with second package components 130 that also comprise semiconductor dies as a system, packaged semiconductor devices 160 comprising SOCs are formed.

Figure 12:
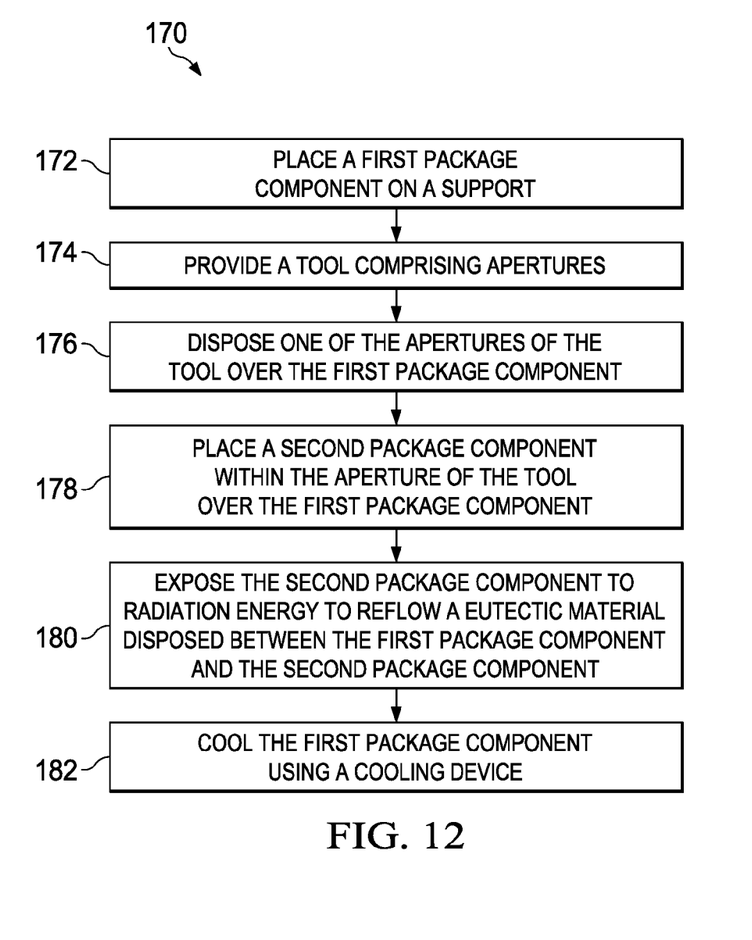
FIG. 12 is a flow chart of a method of processing a semiconductor device in accordance with some embodiments.

FIG. 12 is a flow chart 170 of a method of processing a semiconductor device in accordance with some embodiments. In step 172, a first package component 120 is placed on a support 108 (see also FIG. 5). In step 174, a tool 112 is provided that comprises a plurality of apertures 114 (FIG. 6). In step 176, one of the apertures 114 of the tool 112 is disposed over the first package component 120 (FIG. 7). In step 178, a second package component 130 is placed within the aperture 114 of the tool 112 over the first package component 120 (FIG. 8). In step 180, the second package component 130 is exposed to radiation energy 104 to reflow a eutectic material 134 disposed between the first package component 120 and the second package component 130 (FIG. 9). In step 182, the first package component 120 is cooled using a cooling device 110 (FIG. 10).

Some embodiments of the present disclosure include novel systems 100 that include the cooling devices 110 described herein. Other embodiments include methods of processing semiconductor devices using the systems 100. Some embodiments of the present disclosure also include packaged semiconductor devices 160 that have been processed using the novel systems 100 and methods described herein.

Advantages and benefits of some embodiments of the disclosure include providing novel methods and systems 100 for eutectic materials 134 that result in improved process control and reduced risk of damage to the first package component 120 material layers. The first package components 120 may include organic and/or ELK, and reducing the temperature of the first package substrates 120 during the eutectic material 134 solidification prevents damage to the organic and ELK materials of the first package components 120 from the eutectic material 134 reflow process. Embodiments of the present disclosure provide novel tool settings wherein the first package component 120 temperature during the eutectic material 134 solidification is reduced, which reduces or avoids failures from ELK material delamination of the first package components 120 during and after solder reflow processes. As an example, experimental results showed a greater than about a 75% reduction in ELK material stress by decreasing first package component 120 temperature during solder (e.g., eutectic material 134) solidification.

Cooling the first package components 120 using the cooling device 110 also facilitates in the cooling of the eutectic material 134 to form re-solidified eutectic bonds between the first package components 120 and the second package components 130, resulting in time and cost savings. Furthermore, the novel systems 100 and process flows described herein are easily implementable in semiconductor device processing systems and process flows.

In accordance with some embodiments of the present disclosure, a system for processing semiconductor devices includes a radiation energy source, a support, and a tool disposable between the support and the radiation energy source. The tool includes apertures adapted to retain a package component over the support. The system includes a cooling device proximate the support.

In accordance with other embodiments, a system for processing semiconductor devices includes a radiation energy source, a support, and a tool disposable between the support and the radiation energy source. The tool comprises a plurality of apertures adapted to retain a package component over the support. The system includes a cooling device proximate the support, and a controller in communication with the cooling device and the radiation energy source.

In accordance with other embodiments, a method of processing a semiconductor device includes placing a first package component on a support, providing a tool comprising a plurality of apertures, and disposing one of the plurality of apertures of the tool over the first package component. A second package component is placed within the one of the plurality of apertures of the tool over the first package component. The second package component is exposed to radiation energy to reflow a eutectic material disposed between the first package component and the second package component. The first package component is cooled using a cooling device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for processing semiconductor devices, comprising:
   a radiation energy source;
   a support configured to support a first package component;
   a tool disposed between the support and the radiation energy source, wherein the tool comprises a plurality of apertures adapted to retain a second package component over the support and align contacts of the second package component with contacts of the first package component;
   a cooling device proximate the support; and
   a controller in communication with the cooling device and the radiation energy source, the controller configured to:
      activate the radiation energy source to heat the second package component to a first temperature, thereby reflowing a eutectic material and bonding the second package component to the first package component; and
      after the eutectic material is reflowed and while the eutectic material solidifies, activate the cooling device to cool the support while the radiation energy source is active, thereby simultaneously maintaining the second package component at a second temperature less than the first temperature and cooling the first package component to a third temperature less than the second temperature.

2. The system according to claim 1, wherein the cooling device comprises a reservoir for a cooling substance and a dispenser coupled to the reservoir.

3. The system according to claim 2, wherein the reservoir contains liquid nitrogen or water.

4. The system according to claim 1, wherein the cooling device comprises a fan that moves air or gas proximate the support.

5. The system according to claim 1, wherein the cooling device comprises a cooling module.

6. The system according to claim 5, wherein the cooling module contains a cooling agent.

7. The system according to claim 1, wherein the radiation energy source comprises an infrared (IR) lamp.

8. The system according to claim 1, wherein the support comprises a board or a boat adapted to support the first package component.

9. The system according to claim 1, wherein the radiation energy source is adapted to increase a temperature of the second package component to reflow the eutectic material disposed between the second package component and the first package component prior to simultaneously heating the second package component and cooling the first package component while the eutectic material solidifies.

10. A method of processing a semiconductor device, the method comprising:
    placing a first package component on a support;
    providing a tool comprising a plurality of apertures, wherein each of the plurality of apertures comprises an opening dimension, and wherein the tool further comprises a solid portion disposed between adjacent ones of the plurality of apertures;
    disposing the adjacent ones of the plurality of apertures of the tool over the first package component, wherein the first package component extends continuously from a first sidewall of the solid portion to a second sidewall of the solid portion opposite the first sidewall in a cross-sectional view when the tool is disposed over the first package component;
    placing a second package component within the one of the plurality of apertures of the tool over the first package component, wherein the opening dimension of each of the plurality of apertures is substantially the same as a size of the second package component in top view;
    exposing the second package component to radiation energy to reflow a eutectic material disposed between the first package component and the second package component, wherein the radiation energy raises a temperature of the second package component to a first temperature of about 217 degrees C. or greater;
    after reflowing the eutectic material and while exposing the second package component to radiation energy to maintain the temperature of the second package component at a second temperature of about 180 degrees C., cooling the first package component using a cooling device to a third temperature of about 80 degrees C. or less, wherein the second temperature is less than the first temperature and the third temperature is less than the second temperature; and
    while the eutectic material is re-solidifying, maintaining a temperature differential between the first package component and the second package component to be about 100 degrees C.

11. The method according to claim 10, wherein cooling the first package component comprises the re-solidifying the eutectic material, and wherein reflowing the eutectic material and re-solidifying the eutectic material comprise bonding the second package component to the first package component.

12. The method according to claim 10, wherein the cooling further comprises:
    dispensing a cooling substance onto a bottom surface of the support.

13. The method according to claim 12, wherein the cooling substance is liquid nitrogen or water.

14. The method according to claim 10, further comprising providing a controller in communication with the cooling device and a heating device, the controller configured to control the heating device to maintain the temperature of the second package component at about 180 degrees C. and to control the cooling device to cool the first package component to a temperature of about 80 degrees C. or less.

15. The method according to claim 10, wherein the solid portion is disposed over a scribe line region of the first package component, and wherein the method further comprises after re-solidifying the eutectic material, singulating the first package component along the scribe line region.

16. The method according to claim 10, wherein the maintaining a temperature differential between the first package component and the second package component to be about 100 degrees C. while the eutectic material is re-solidifying comprises exposing the second package component to radiation energy to heat the second package component while the eutectic material is re-solidifying.

17. A method comprising:
  placing a plurality of first package components on a support;
  attaching a tool to a top side of the support, the tool comprising a plurality of apertures;
  disposing a plurality of second package components in the apertures of the tool over the support;
  forming a eutectic material between the second package components and the first package components;
  activating a radiation energy source over the second package components to heat the second package components to a first temperature and reflow the eutectic material; and
  after reflowing the eutectic material and while the eutectic material solidifies, activating a cooling device proximate an under side of the support while the radiation energy source is active to maintain the second package components at a second temperature less than the first temperature while cooling the first package components to a third temperature less than the second temperature.

18. The method of claim 17, wherein cooling the first package components re-solidifies the eutectic material, and wherein reflowing the eutectic material and re-solidifying the eutectic material bonds the second package components to the first package components.

19. The method of claim 17, wherein activating the cooling device comprises:
  dispensing a cooling substance onto a bottom surface of the support.

20. The method of claim 19, wherein the cooling substance is liquid nitrogen or water.

* * * * *